United States Patent
Nishihara

(10) Patent No.: US 11,300,612 B2
(45) Date of Patent: Apr. 12, 2022

(54) DEBUG SUPPORT DEVICE, DEBUG SUPPORT METHOD, AND COMPUTER READABLE STORAGE MEDIUM

(71) Applicant: Mitsubishi Electric Corporation, Tokyo (JP)

(72) Inventor: Masaki Nishihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/429,634

(22) PCT Filed: Apr. 18, 2019

(86) PCT No.: PCT/JP2019/016661
§ 371 (c)(1),
(2) Date: Aug. 10, 2021

(87) PCT Pub. No.: WO2020/213129
PCT Pub. Date: Oct. 22, 2020

(65) Prior Publication Data
US 2022/0043060 A1 Feb. 10, 2022

(51) Int. Cl.
*G01R 31/317* (2006.01)
*G01R 31/3185* (2006.01)
(52) U.S. Cl.
CPC . *G01R 31/31705* (2013.01); *G01R 31/31713* (2013.01); *G01R 31/318536* (2013.01)
(58) Field of Classification Search
None
See application file for complete search history.

(56) References Cited

U.S. PATENT DOCUMENTS

| | | |
|---|---|---|
| 2011/0270424 A1 | 11/2011 | Nakai et al. |
| 2014/0304551 A1 | 10/2014 | Nakai et al. |
| 2018/0314225 A1 | 11/2018 | Bisse et al. |

FOREIGN PATENT DOCUMENTS

| | | |
|---|---|---|
| JP | 10-49206 A | 2/1998 |
| JP | 2012-256178 A | 12/2012 |
| JP | 5138090 B2 | 2/2013 |
| JP | 5362148 B1 | 12/2013 |

(Continued)

OTHER PUBLICATIONS

International Search Report and Written Opinion dated Jun. 18, 2019, received for PCT Application PCT/JP2019/016661, Filed on Apr. 18, 2019, 10 pages including English Translation.

(Continued)

*Primary Examiner* — Guerrier Merant
(74) *Attorney, Agent, or Firm* — Xsensus LLP

(57) ABSTRACT

A debug support device includes: a root device extraction unit that extracts, from a sequence program that includes a circuit block including a plurality of devices, a result device on the basis of an association between a factor device that contributes to determination of a value of another device and the result device having the value determined by the factor device; a related device retrieval unit that retrieves, as a related device, each and every one of the factor device(s) that determines the value of the result device; and a display control unit that outputs group information to a display device. The group information is information on a group, associating the result device, the value of the result device, the related device, and a value of the related device.

12 Claims, 8 Drawing Sheets

(56) References Cited

FOREIGN PATENT DOCUMENTS

JP 6150953 B2 6/2017

OTHER PUBLICATIONS

Notice of Reason for Refusal dated Oct. 23, 2019, received for JP Application No. 2019-551407, 8 pages including English Translation.

Decision to Grant dated Jan. 21, 2020, received for JP Application No. 2019-551407, 5 pages including English Translation.

| NAME ▼ | CURRENT VALUE | DISPLAY FORMAT | DATA TYPE |
|---|---|---|---|
| Y0 | FALSE | BINARY | BIT |
| M2 | FALSE | BINARY | BIT |
| M1 | FALSE | BINARY | BIT |
| X1 | FALSE | BINARY | BIT |
| M0 | FALSE | BINARY | BIT |
| X0 | FALSE | BINARY | BIT |
| X2 | FALSE | BINARY | BIT |
| X3 | FALSE | BINARY | BIT |

| NAME ▼ | CURRENT VALUE | DISPLAY FORMAT | DATA TYPE |
|---|---|---|---|
| Y0 | FALSE | BINARY | BIT |
| X0 | FALSE | BINARY | BIT |

161

| NAME ▼ | CURRENT VALUE | DISPLAY FORMAT | DATA TYPE |
|---|---|---|---|
| Y0 | FALSE | BINARY | BIT |
| M0 | FALSE | BINARY | BIT |
| X0 | FALSE | BINARY | BIT |

FIG.9

180

| NAME | | CURRENT VALUE | DISPLAY FORMAT | DATA TYPE |
|---|---|---|---|---|
| Y0 | Y0 | FALSE | BINARY | BIT |
| M2 | Y1 | FALSE | BINARY | BIT |
| M1 | | FALSE | BINARY | BIT |
| X1 | | FALSE | BINARY | BIT |
| M0 | | FALSE | BINARY | BIT |
| X0 | | FALSE | BINARY | BIT |
| X2 | | FALSE | BINARY | BIT |
| X3 | | FALSE | BINARY | BIT |
| Y1 | | FALSE | BINARY | BIT |
| D2 | | 0 | DECIMAL | WORD [WITH SIGN] |
| D1 | | 0 | DECIMAL | WORD [WITH SIGN] |
| D0 | | 0 | DECIMAL | WORD [WITH SIGN] |
| M4 | | FALSE | BINARY | BIT |
| X4 | | FALSE | BINARY | BIT |

⇩

181

| NAME | Y0 ▼ | CURRENT VALUE | DISPLAY FORMAT | DATA TYPE |
|---|---|---|---|---|
| Y0 | | FALSE | BINARY | BIT |
| M2 | | FALSE | BINARY | BIT |
| M1 | | FALSE | BINARY | BIT |
| X1 | | FALSE | BINARY | BIT |
| M0 | | FALSE | BINARY | BIT |
| X0 | | FALSE | BINARY | BIT |
| X2 | | FALSE | BINARY | BIT |
| X3 | | FALSE | BINARY | BIT |

| NAME | Y0 ▼ | CURRENT VALUE | DISPLAY FORMAT | DATA TYPE |
|---|---|---|---|---|
| Y0 | ▼ | FALSE | BINARY | BIT |
| M2 | LEVEL 1 | FALSE | BINARY | BIT |
| M1 | LEVEL 2 | FALSE | BINARY | BIT |
|  | LEVEL 3 |  |  |  |
| X1 |  | FALSE | BINARY | BIT |
| M0 |  | FALSE | BINARY | BIT |
| X0 |  | FALSE | BINARY | BIT |
| X2 |  | FALSE | BINARY | BIT |
| X3 |  | FALSE | BINARY | BIT |

⬇

| NAME | Y0 ▼ | CURRENT VALUE | DISPLAY FORMAT | BINARY |
|---|---|---|---|---|
| Y0 | LEVEL 1 ▼ | FALSE | BINARY | BIT |
| M2 |  | FALSE | BINARY | BIT |
| X3 |  | FALSE | BINARY | BIT |

| NAME | Y0 ▼ | CURRENT VALUE | DISPLAY FORMAT | DATA TYPE |
|---|---|---|---|---|
| Y0 | ▼ | FALSE | BINARY | BIT |
| M2 | LEVEL 1 | FALSE | BINARY | BIT |
| M1 | LEVEL 2 | FALSE | BINARY | BIT |
|  | LEVEL 3  LEVEL 3-1 |  |  |  |
| X1 | LEVEL 3-2 | FALSE | BINARY | BIT |
| M0 |  | FALSE | BINARY | BIT |
| X0 |  | FALSE | BINARY | BIT |
| X2 |  | FALSE | BINARY | BIT |
| X3 |  | FALSE | BINARY | BIT |

⇩

| NAME | Y0 ▼ | CURRENT VALUE | DISPLAY FORMAT | DATA TYPE |
|---|---|---|---|---|
| M1 | LEVEL 3-1 ▼ | FALSE | BINARY | BIT |
| X1 |  | FALSE | BINARY | BIT |

DEBUG SUPPORT DEVICE, DEBUG SUPPORT METHOD, AND COMPUTER READABLE STORAGE MEDIUM

CROSS-REFERENCE TO RELATED APPLICATION

The present application is based on PCT filing PCT/JP2019/016661, filed Apr. 18, 2019, the entire contents of which are incorporated herein by reference.

FIELD

The present invention relates to a debug support device, a debug support method, and a debug support program that assist in debugging sequence programs.

BACKGROUND

An industrial controller called a programmable logic controller (PLC) is generally used in production equipment of a plant. A sequence program is a control program to be executed by the PLC and is created using a sequence program creation device.

To verify whether the created sequence program runs as expected, a user checks values of various devices such as input devices and output devices when debugging the sequence program. Some sequence program creation devices include debug support devices intended for debugging.

A sequence program creation device described in Patent Literature 1 verifies a sequence program by emulation and displays a verification result. When a user specifies a device that is a conceivable cause of anomaly on the basis of the verification result, the sequence program creation device described in Patent Literature 1 extracts and displays a list of devices related to this device.

CITATION LIST

Patent Literature

Patent Literature 1: Japanese Patent Application Laid-open No. H10-49206

SUMMARY

Technical Problem

However, because values of the related devices are not displayed with the above technique described in Patent Literature 1, the user needs to go through a process of having the values of the related devices displayed. This makes debugging laborious.

The present invention has been made in view of the above, and an object of the present invention is to obtain a debug support device that enables less laborious debugging.

Solution to Problem

A debug support device according to an aspect of the present invention includes a result device extraction unit that extracts, from a sequence program that includes a circuit block including a plurality of devices, a result device on the basis of an association between a factor device that contributes to determination of a value of another device and the result device a value of which is determined by the factor device. The debug support device according to the present invention also includes a related device retrieval unit that retrieves, as a related device, each and every one of the factor device(s) that determines the value of the result device, and a display control unit that outputs group information to a display device. The group information is information on a group, associating the result device, the value of the result device, the related device, and a value of the related device.

Advantageous Effect of Invention

The debug support device according to the present invention enables less laborious debugging.

BRIEF DESCRIPTION OF DRAWINGS

FIG. 9 illustrates a process that the debug support device according to the embodiment performs to extract devices in a specified group and have these devices displayed.

DESCRIPTION OF EMBODIMENT

With reference to the drawings, a detailed description is hereinafter provided of a debug support device, a debug support method, and a debug support program according to an embodiment of the present invention. It is to be noted that this embodiment is not restrictive of the present invention.

Embodiment

Figure 1:
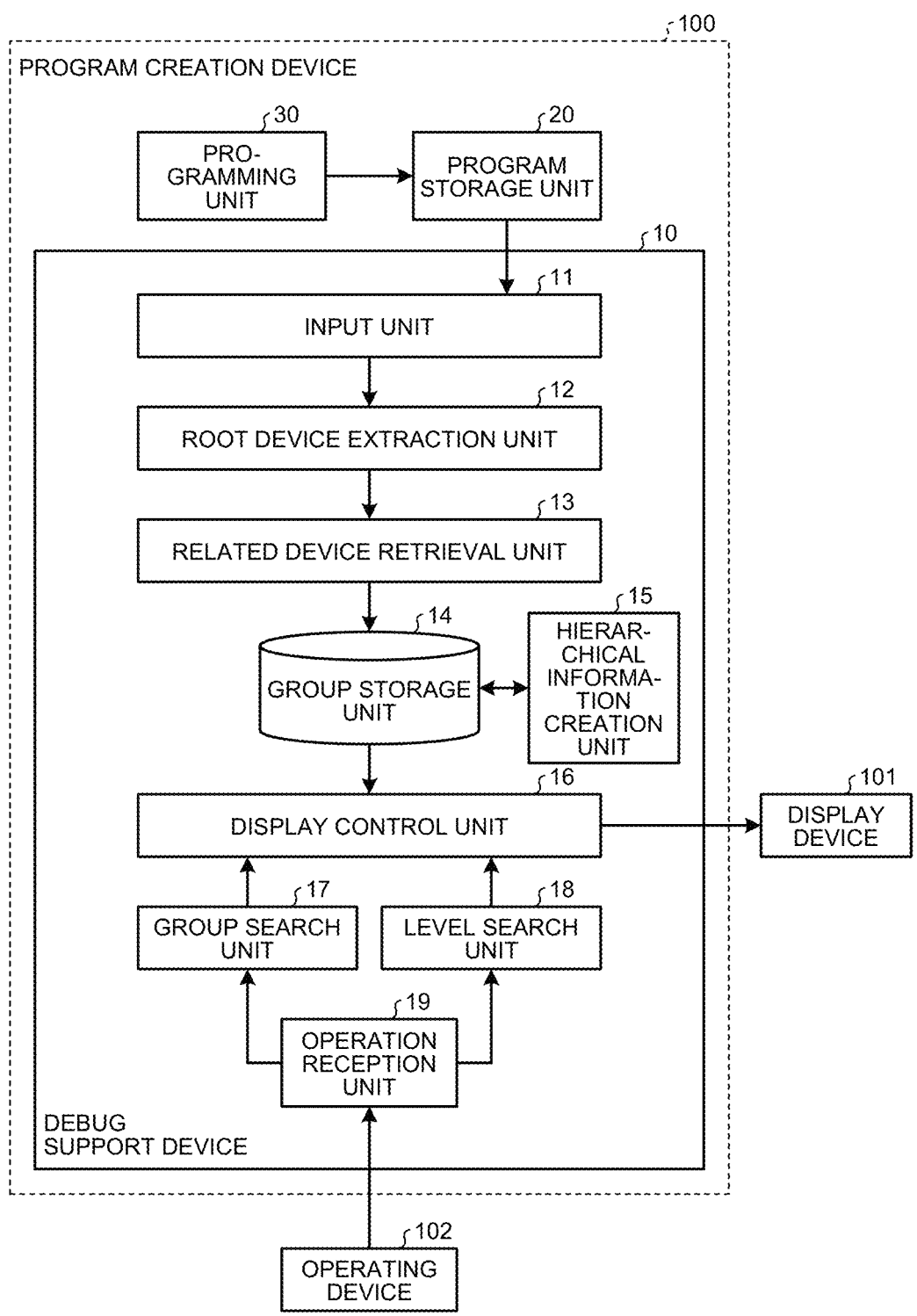
FIG. 1 illustrates a configuration of a program creation device including a debug support device according to an embodiment.

FIG. 1 illustrates a configuration of a program creation device including a debug support device according to the embodiment. The program creation device 100 creates and edits a sequence program such as a ladder program and assists in debugging the sequence program. The program creation device 100 includes a programming unit 30, the debug support device 10, and a program storage unit 20.

The programming unit 30 creates the sequence program according to instructions from a user. The programming unit 30 stores the created sequence program in the program storage unit 20.

The debug support device 10 assists in debugging the sequence program and causes display of a list or hierarchy of devices to be debugged, such as input devices and output devices, along with values of the devices. The value of each of the devices is information indicating a status of the device. The program storage unit 20 is, for example, a memory storing the sequence program. The debug support device 10 may be external to the program creation device 100.

A description is provided here of definitions of terms used in the embodiment.

Factor device: a device that contributes to determination of a value of another device (result device)

Result device: a device having its value determined by another device (factor device). The result device can be a factor device for another result device.

Root device: a device among the result devices that is not a factor device for each and every one of the result devices in the sequence program. In other words, the root device refers to the device among the result devices that does not behave as the factor device.

Circuit block: a constituent element of the sequence program. The circuit block is composed of multiple or a single circuit element and an interconnect line. The single circuit block refers to an area defined by the circuit element (s) and the single interconnect line that connect a left bus bar and a right bus bar.

Group: a group of devices in the sequence program that is composed of the root device and every factor device determining the value of the root device.

Level: devices in the circuit block. The circuit blocks including the root device and the factor devices are each assigned one level.

Level number: a number of the level. The level number is an identifier that distinguishes (identifies) the circuit block in the group. The farther the circuit block is in the hierarchy from the circuit block including the root device, the larger the level number.

Hierarchical display: a display that enables visual recognition of each dependency relation between the factor device and the result device. The devices are divided according to the level number and are displayed hierarchically.

The root device is the last result device in the group, so that the value of the root device is important in debugging. For this reason, the debug support device 10 according to the present embodiment extracts, from a sequence program that has circuit blocks including a plurality of devices, a root device on the basis of each association between the factor device and the result device and extracts all those factor devices that each determine a value of the root device. The debug support device 10 then outputs information on this group (hereinafter referred to as "group information") to a display device 101, which in turn displays the group information. In the group information, the root device, the value of the root device, those related devices, and respective values of the related devices are associated. In other words, the debug support device 10 automatically extracts the factor devices that each affect the root device and has the value of the root device and the values of the factor devices displayed.

The program creation device 100 is connected to the display device 101, an operating device 102, and a PLC that is not illustrated. The display device 101 is a device that displays information, such as a liquid crystal display monitor. The operating device 102 includes devices that are used to operate the program creation device 100, such as a mouse and a keyboard.

The program creation device 100 is implemented with use of a software tool that runs on a computer such as a personal computer. Functions of the program creation device 100 include assisting in creating and editing a sequence program, collecting, for display, an operating state of a sequence program in equipment from the PLC, and transferring an edited sequence program to the PLC, among others.

The debug support device 10 includes an input unit 11, a root device extraction unit 12, a related device retrieval unit 13, a group storage unit 14, a hierarchical information creation unit 15, a display control unit 16, a group search unit 17, a level search unit 18, and an operation reception unit 19.

The input unit 11 accepts the sequence program, which is sent from the program storage unit 20, and inputs the sequence program to the root device extraction unit 12. The root device extraction unit 12 retrieves the root device from the sequence program on the basis of each association between the factor device and the result device in the sequence program. The root device extraction unit 12 sends the sequence program and the root device to the related device retrieval unit 13.

The related device retrieval unit 13 retrieves the devices related to the root device from the sequence program. The devices related to the root device are the factor devices that determine the value of the root device. In a description below, the devices related to the root device may be referred to as the related devices.

Each of the related devices is a direct or indirect factor device for the root device. The indirect factor device affects the value of the root device via another factor device (result device for the indirect factor device). How many levels (circuit blocks) over which the effects on value of the root device extend corresponds to the hierarchy of the related devices.

The related device retrieval unit 13 sets level numbers for the related devices on the basis of each association between the factor device and the result device in the sequence program. The related device retrieval unit 13 assigns the level number to each of the circuit blocks including the related devices. The related device retrieval unit 13 creates the group information on the group including the root device. The related device retrieval unit 13 creates the group information on the basis of the related device retrieval result and the information sent from the root device extraction unit 12. The process of setting the level numbers for the related devices on the basis of each association between the factor device and the result device in the sequence program may be performed by the group storage unit 14. The process of assigning the level number to each of the circuit blocks including the related devices may be performed by the group storage unit 14. The process of creating the group information on the group including the root device may be performed by the group storage unit 14. A description is hereinafter provided of a case where the related device retrieval unit 13 performs the above-mentioned process of setting the level numbers for the relates devices, the above-mentioned process of assigning the level number to each of the circuit blocks including the related devices, and the above-mentioned process of creating the group information.

The group information includes the root device, the value of the root device, the related devices, the values of the related devices, the level numbers of the related devices, a group name, a category of each related device, and order of executing the circuit blocks in the group. The category of each related device indicates whether the related device is the factor device or the result device. The related device retrieval unit 13 sets the category of each related device on the basis of each association between the factor device and the result device. It is to be noted that there are cases where the group information includes sub-numbers (described later). The related device retrieval unit 13 stores the created group information in the group storage unit 14. The group storage unit 14 stores the group information.

The hierarchical information creation unit 15 creates information on hierarchical display of the related devices in the group on the basis of the group information. Specifically, the hierarchical information creation unit 15 creates the information indicating a display position of each related device and a display position of the root device on the basis of those retained by the group storage unit 14, namely, the category of each of the devices of the circuit blocks and the level numbers. Because the level number and the category are set on the basis of each association between the factor device and the result device, the hierarchical information creation unit 15 can also be said to create the information indicating a display position of each related device and the information indicating the display position of the root device on the basis of each association between the factor device and the result device.

The display control unit 16 causes the display device 101 to display information on the group on the basis of the group information stored in the group storage unit 14. The display control unit 16 also switches the items being displayed to items specified by the group search unit 17 and the level search unit 18.

The operation reception unit 19 accepts and sends, to the group search unit 17 or the level search unit 18, information corresponding to content of an operation from the operating device 102. When the operation is about group retrieval, the operation reception unit 19 sends the information corresponding to the operation content to the group search unit 17. When the operation is about level retrieval, the operation reception unit 19 sends the information corresponding to the operation content to the level search unit 18. The group search unit 17 sends, to the display control unit 16, an instruction for display of the devices in the specified group (under the specified group name). The level search unit 18 sends, to the display control unit 16, an instruction for display of the devices at the specified level (with the specified level number).

The debug support device 10 may cause, on the basis of the result device instead of the root device, the display device 101 to display the value of the result device and the value(s) of the factor device(s). In other words, the debug support device 10 automatically extracts the factor device(s) affecting the result device and has group information including the value of the result device and the value(s) of the factor device(s) displayed on the display device 101. In this case, the root device extraction unit 12 retrieves the result device instead of the root device. The related device retrieval unit 13 retrieves the factor device(s) related to the result device from the sequence program. In this case, the group information includes the result device, the value of the result device, the related device(s), and the value(s) of the related device(s). The hierarchical information creation unit 15 creates information indicating the display position(s) of the related device(s) and the display position of the result device.

Figure 2:
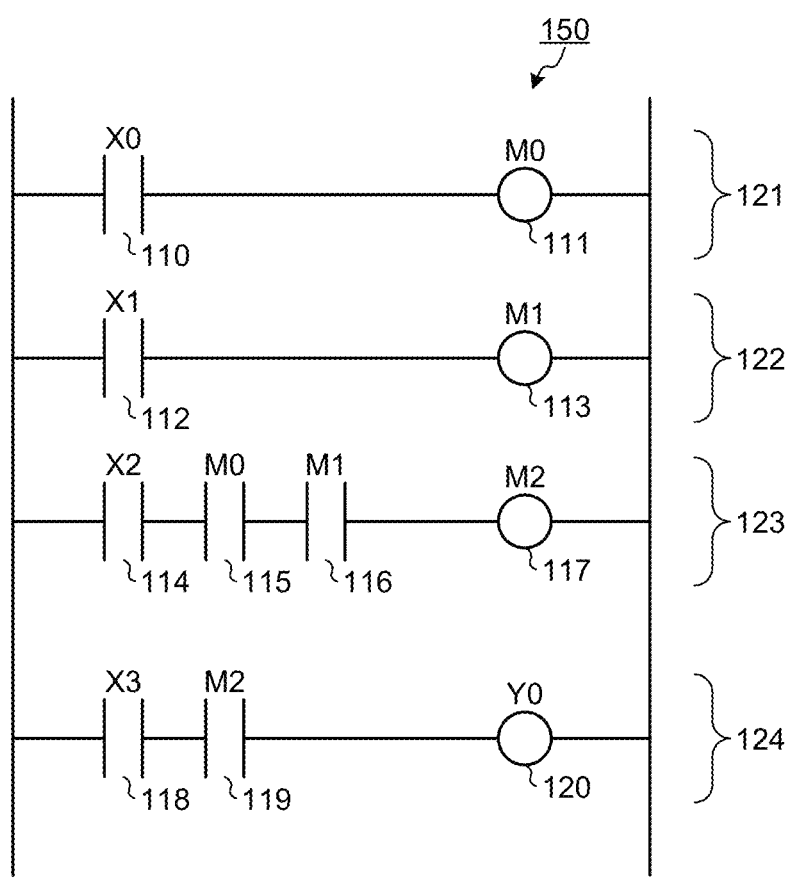
FIG. 2 illustrates a first example of a sequence program that is created by the program creation device, which includes the debug support device according to the embodiment.

FIG. 2 illustrates a first example of the sequence program that is created by the program creation device, which includes the debug support device according to the embodiment. The programming unit 30 creates the sequence program 150 according to instructions from the user. The sequence program 150 includes one or more circuit blocks. The circuit blocks of the sequence program 150 in FIG. 2 are four in number: the circuit block 121, the circuit block 122, the circuit block 123, and the circuit block 124. The sequence program 150 is executed in order, starting with the top circuit block. When hereinafter described without distinction, the circuit blocks 121 to 124 may be referred to as "circuit blocks CB".

Each of the circuit blocks CB includes a plurality of circuit elements. Each of the circuit elements includes a circuit symbol and a device. The circuit symbol is a symbol representing a type of circuit such as a contact or a coil and corresponds to an instruction in PLC processing. The device represents data that is a processing target of the circuit symbol (instruction).

A device symbol of each of the devices is predetermined according to data class. For example, X devices refer to input devices, Y devices refer to output devices, M devices refer to internal relay devices, and D devices refer to data registers. The device is denoted by a combination of the device symbol and an address. For example, the input device with address 0 is written as "X0", and the output device with address 0 is written as "Y0". The address here refers to a location (memory address) in memory space of the PLC. Therefore, a value of each of the devices is stored in an area corresponding to the memory address of each device.

Each circuit block CB includes the plurality of devices. Specifically, the circuit block 121 includes the X0 device 110 and the M0 device 111, and the circuit block 122 includes the X1 device 112 and the M1 device 113. The circuit block 123 includes the X2 device 114, the M0 device 115, the M1 device 116, and the M2 device 117, and the circuit block 124 includes the X3 device 118, the M2 device 119, and the Y0 device 120.

Figures 3, 4:
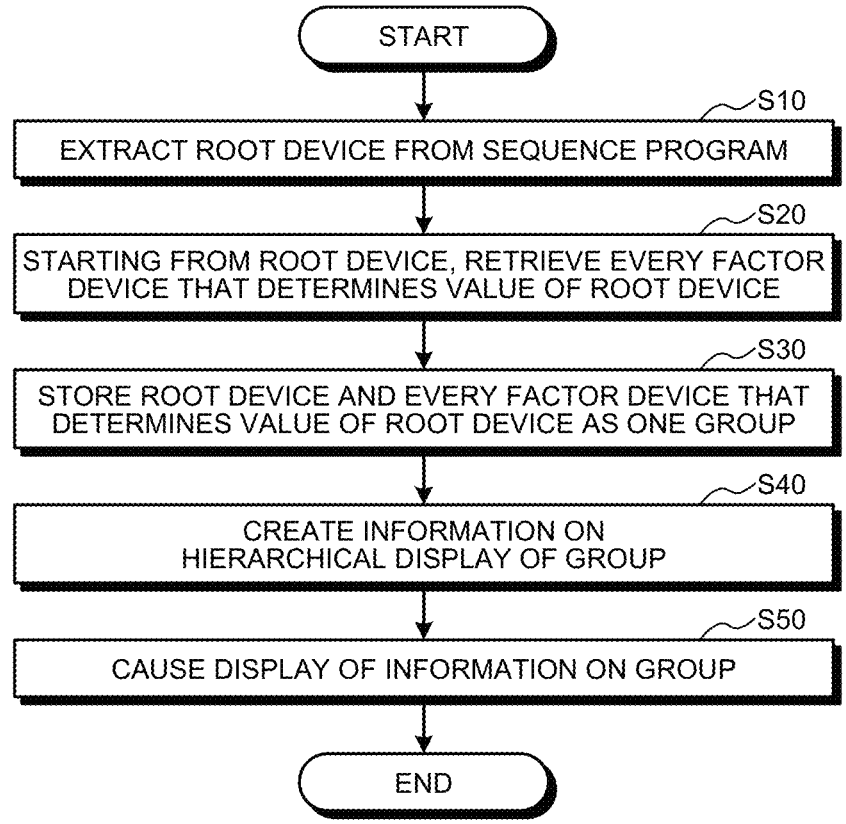
FIG. 3 is a flowchart illustrating a data processing procedure that the debug support device according to the embodiment follows.
FIG. 4 illustrates hierarchical display information on a group extracted from the sequence program illustrated in FIG. 2.

FIG. 3 is a flowchart illustrating a data processing procedure that the debug support device according to the embodiment follows. A description is provided here of a case where the debug support device 10 performs data processing on the sequence program 150 illustrated in FIG. 2.

The input unit 11 accepts the sequence program 150, which is sent from the program storage unit 20, and inputs the sequence program 150 to the root device extraction unit 12. The root device extraction unit 12 extracts a root device from the sequence program 150 (step S10). Because the root device is a result device, the root device extraction unit 12 extracts result devices from the sequence program 150 and extracts the root device from among the extracted result devices. In other words, the root device extraction unit 12 extracts, as the result devices, the M0 device 111, the M1 device 113, the M2 device 117, and the Y0 device 120 from the circuit blocks CB. The root device that the root device extraction unit 12 extracts from among the extracted result devices, is the Y0 device 120, which is not the factor device for each and every one of the result devices in the sequence program 150.

The root device extraction unit 12 sends the sequence program 150 and the root device to the related device retrieval unit 13. It is to be noted that a plurality of root devices may be extracted, depending on the sequence program.

Starting from the root device, the related device retrieval unit 13 retrieves all those factor devices that each determine the value of the root device (step S20). In other words, the related device retrieval unit 13 retrieves, from the sequence program 150, all the factor devices that each affect the value of the Y0 device 120, which is the root device. The related device retrieval unit 13, at first, checks the circuit block 124, which includes the Y0 device 120, for any factor devices and determines that the M2 device 119 and the X3 device 118 are the factor devices for the Y0 device 120, which is the root device.

Because each of these factor devices may be a result device for another device, the related device retrieval unit 13 retrieves factor devices for the M2 device 119 and any factor devices for the X3 device 118 from the sequence program 150.

The M2 device 119 is the result device for the M2 device 117 in the circuit block 123. Therefore, the related device retrieval unit 13 extracts the M1 device 116, the M0 device 115, and the X2 device 114, which are the factor devices in the circuit block 123, as the factor devices for the Y0 device 120, which is the root device.

Because the X3 device 118, which is the factor device in the circuit block 124, is not a result device for any other device, the related device retrieval unit 13 ends the device retrieval in relation to the X3 device 118.

Because each of the factor devices in the circuit block 123, namely, the M1 device 116, the M0 device 115, and the X2 device 114 may each be a result device for another device, the related device retrieval unit 13 retrieves factor devices for the M1 device 116, any factor devices for the M0 device 115, and any factor devices for the X2 device 114 from the sequence program 150.

The M1 device 116 is the result device for the M1 device 113 in the circuit block 122. Therefore, the related device retrieval unit 13 extracts the X1 device 112, which is the factor device in the circuit block 122, as the factor device for the Y0 device 120, which is the root device.

The M0 device 115 is the result device for the M0 device 111 in the circuit block 121. Therefore, the related device retrieval unit 13 extracts the X0 device 110, which is the factor device in the circuit block 121, as the factor device for the Y0 device 120, which is the root device.

Because the X2 device 114, which is the factor device in the circuit block 123, is not a result device for any other device, the related device retrieval unit 13 ends the device retrieval in relation to the X2 device 114.

Because the X1 device 112, which is the factor device in the circuit block 122, is not a result device for any other device, the related device retrieval unit 13 ends device retrieval in relation to the X1 device 112.

Similarly, the X0 device 110, which is the factor device in the circuit block 121, is not a result device for any other device, so that the related device retrieval unit 13 ends device retrieval in relation to the X0 device 110.

In this way, the related device retrieval unit 13 extracts the M2 device 119, the X3 device 118, the M1 device 116, the M0 device 115, the X2 device 114, the X1 device 112, and the X0 device 110 as the factor devices for the Y0 device 120, which is the root device.

The related device retrieval unit 13 sends the name of the extracted root device and the names of the extracted related devices to the group storage unit 14. Accordingly, the group storage unit 14 stores the name of the root device and the names of the related devices. In other words, the group storage unit 14 stores, as one group, the root device retrieved by the root device extraction unit 12, and all the factor devices that have been retrieved by the related device retrieval unit 13 as determining the value of the root device (step S30).

The related device retrieval unit 13 also sends the value of the extracted root device and the values of the extracted factor devices to the group storage unit 14. The group storage unit 14 stores the value of the extracted root device and the values of the extracted factor devices.

The group storage unit 14 also holds a group name identifying the group, level numbers identifying the circuit blocks CB in the group, a category of each of the devices of the circuit blocks CB, and order of executing the circuit blocks CB in the group.

The group name, the level numbers, the category, and the execution order are determined by the related device retrieval unit 13, associated with the root device and the related devices, and stored in the group storage unit 14.

The related device retrieval unit 13 uses, for example, the name of the root device as the group name. If the root device is the Y0 device 120, the group name is "Y0". The related device retrieval unit 13 determines the level numbers on the basis of each association between the result device and the factor device in the group and the order of executing the circuit blocks included in the sequence program. In a description below, a level with level number R (with R being a natural number) is referred to as "level R".

The levels that the related device retrieval unit 13 sets serve as information corresponding to the order of processing the circuit blocks. The later the circuit block comes in the processing order, the smaller its level is numerically set in the present embodiment. Specifically, the related device retrieval unit 13 sets the circuit block including the root device as level 1. When the factor device at level 1 is the result device for any other device, the circuit block including this result device is set as level 2. When the factor device at level 2 is the result device for any other device, the related device retrieval unit 13 sets the circuit block including this result device as level 3. The same rule is used to assign the level numbers that follow. In other words, when the factor device at level N (with N being a natural number) is the result device for any other device, the related device retrieval unit 13 sets the circuit block including this result device as level (N+1).

If each of a plurality of factor devices of a certain circuit block is a result device for any other device, there will be a plurality of identical level numbers. In this case, the related device retrieval unit 13 assigns sub-numbers to the level numbers. The related device retrieval unit 13 determines the sub-numbers according to the order of executing the circuit blocks. In other words, the related device retrieval unit 13 assigns the sub-numbers in sequence, starting with 1 to the latest circuit block in the execution order and adding 1 thereafter. When assigning M sub-numbers (with M being a natural number greater than or equal to 2), the related device retrieval unit 13 assigns sub-number (M−L+1) to the Lth circuit block in the execution order (with L being a natural number greater than or equal to 2 and less than or equal to M).

For the sequence program 150, the related device retrieval unit 13 sets the level number of the circuit block 124 as level 1 and sets the level number of the circuit block 123 as level 2. Because the circuit block 122 and the circuit block 121 are both level 3, the related device retrieval unit 13 assigns sub-numbers on the basis of the order of executing the circuit blocks 122 and 121. In other words, the related device retrieval unit 13 sets the level number of the circuit block 122 as level 3-1 and sets the level number of the circuit block 121 as level 3-2. Consequently, the order of the descending level numbers matches the execution order of the sequence program 150.

The hierarchical information creation unit 15 creates information on hierarchical display of the devices in the group (step S40). The information on the hierarchical display indicates display positions of the devices. The hierarchical information creation unit 15 creates the information indicating the display positions of the devices on the basis of those retained by the group storage unit 14, namely, the level numbers and the category of each of the devices of the circuit blocks. The hierarchical information creation unit 15 stores the created information indicating the display positions in the group storage unit 14. The display control unit 16 causes the display device 101 to display information on the devices in the group on the basis of the group information and the information indicative of the display positions that are stored in the group storage unit 14 (step S50). Specifically, the display control unit 16 creates and outputs hierarchical display information intended for the hierarchical display of the group on the basis of those stored in the group storage unit 14, namely, the name and the value of the root device, the names and the values of the factor devices, the group name, the level numbers, the categories, and the information indicating the display positions. Accordingly, the display device 101 displays information corresponding to the hierarchical display information.

FIG. 4 illustrates the hierarchical display information on the group extracted from the sequence program illustrated in FIG. 2. The hierarchical display information 151 illustrated in FIG. 4 is about the group extracted from the sequence program 150.

The hierarchical display information 151 has the name of the device, the value (current value) of the device, a display format, and a data type associated. In the hierarchical display information 151, the current value, the display format, and the data type are displayed for each line, corresponding to the name of the device.

The display format in the hierarchical display information 151 indicates whether the value of the device is displayed in binary, decimal or hexadecimal, and the data type indicates whether the value of the device is given in bits or (16-bit) words. Displaying the value of the device in binary is such that the value to display is "TRUE" when the bit device is on and "FALSE" when the bit device is off. Displaying the value of the device in decimal is such that the value to display is "1" when the bit device is on and "0" when the bit device is off. Columns for the names in the hierarchical display information 151 serve to provide an image of the hierarchical display.

The names of the devices are displayed in the hierarchical display information 151, with the columns corresponding with level numbers of levels where the devices belong. The leftmost column shown here is for the level-1 device, the second column from the left is for the level-2 devices, the third column from the left is for the level-3 devices, and the fourth column from the left is for the level-4 devices.

In the hierarchical display information 151, the root device (Y0 device 120) is displayed in a first row, and the first level-2 factor device (M2 device 119) for the Y0 device 120 is displayed in a second row. The first level-3 factor device (M1 device 113) for the M2 device 119 is displayed in a third row, and the level-4 factor device (X1 device 112) for the M1 device 113 is displayed in a fourth row.

The second level-3 factor device (M0 device 115) for the M2 device 119 is displayed in a fifth row, and the level-4 factor device (X0 device 110) for the M0 device 115 is displayed in a sixth row. The third level-3 factor device (X2 device 114) for the M2 device 119 is displayed in a seventh row. The second level-2 factor device (X3 device 118) for the Y0 device 120 is displayed in an eighth row.

Devices are displayed hierarchically so that if a level-P device (with P being a natural number greater than or equal to 2) displayed in a Qth row (with Q being a natural number greater than or equal to 2) is a result device, a level level-(P+1) device displayed immediately after the Qth row is a factor device. For example, if the level-3 M1 device 113 displayed in the third row is the result device, the level-4 X1 device 112 displayed in the row immediately thereafter, namely, the fourth row is the factor device. In order to allow each association between the factor device and the result device to be understood, the hierarchical display information 151 thus has the devices displayed in a tree structure.

Figures 5, 6:
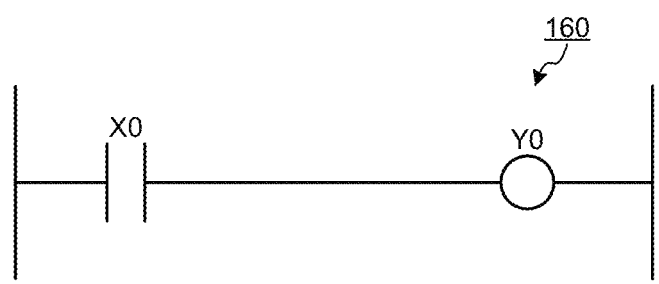
FIG. 5 illustrates a second example of the sequence program that is created by the program creation device, which includes the debug support device according to the embodiment.
FIG. 6 illustrates hierarchical display information on a group extracted from the sequence program illustrated in FIG. 5.

Using two examples of the sequence program, a description is provided here of hierarchical display images. FIG. 5 illustrates the second example of the sequence program that is created by the program creation device, which includes the debug support device according to the embodiment. FIG. 6 illustrates hierarchical display information on a group extracted from the sequence program illustrated in FIG. 5. FIG. 6 is the hierarchical display image of the hierarchical display information 161 from the corresponding sequence program 160 illustrated in FIG. 5 that the display control unit 16 has caused the display device 101 to display.

The sequence program 160 illustrated in FIG. 5 has one circuit block that includes an X0 device and a Y0 device. A dependency relation between these devices is such that the X0 device is a factor device, while the Y0 device is a result device. The Y0 device is a root device, and a value of this root device is entirely determined by the factor device, which is the X0 device. Because a circuit block including a root device is to be set as level 1, a level number assigned to a level is 1.

The hierarchical display information 161 illustrated in FIG. 6 is what has been created on the basis of the sequence program 160. Columns for names in the hierarchical display information 161 serve to provide the hierarchical display image.

Figures 7, 8:
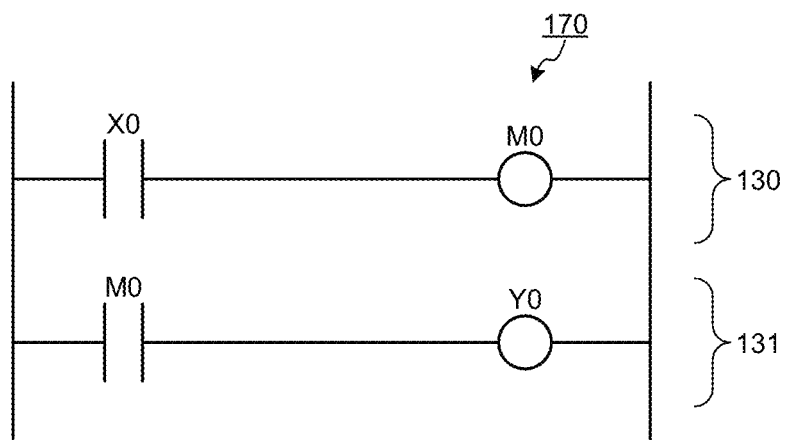
FIG. 7 illustrates a third example of the sequence program that is created by the program creation device, which includes the debug support device according to the embodiment.
FIG. 8 illustrates hierarchical display information on a group extracted from the sequence program illustrated in FIG. 7.

FIG. 7 illustrates the third example of the sequence program that is created by the program creation device, which includes the debug support device according to the embodiment. FIG. 8 illustrates hierarchical display information on a group extracted from the sequence program illustrated in FIG. 7. FIG. 8 is the hierarchical display image of the hierarchical display information 171 from the corresponding sequence program 170 illustrated in FIG. 7 that the display control unit 16 has caused the display device 101 to display.

The sequence program 170 illustrated in FIG. 7 has two circuit blocks, namely, the circuit block 130 and the circuit block 131. The circuit block 130 includes an X0 device and an M0 device. A dependency relation between these devices is such that the X0 device is a factor device, while the M0 device is a result device. The circuit block 131 includes an M0 device and a Y0 device. A dependency relation between these devices is such that the M0 device is a factor device, while the Y0 device is a result device.

The Y0 device is a root device, and the M0 device, which is the factor device in the circuit block 131, and the X0 device, which is the factor device for the M0 device in the circuit block 130, are the all factor devices that determine a value of the root device.

Because the Y0 device is the root device, the circuit block 131 is set as level 1, and the circuit block 130 is set as level 2. This is because the circuit block 131 is executed after the circuit block 130, with the M0 device being the factor device in the circuit block 131 and the result device in the circuit block 130.

The hierarchical display information 171 illustrated in FIG. 8 is what has been created on the basis of the sequence program 170. Columns for names in the hierarchical display information 171 serve to provide the hierarchical display image.

The display control unit 16 causes the display device 101 to display the hierarchical display information 151 illustrated in FIG. 4, the hierarchical display information 161 illustrated in FIG. 6, or the hierarchical display information 171 illustrated in FIG. 8.

As the user operates the operating device 102, with the display device 101 displaying, for example, the hierarchical display information 151, 161, or 171, the operating device 102 sends information corresponding to content of the operation to the operation reception unit 19. The operation reception unit 19 accepts and sends, to the group search unit 17 or the level search unit 18, the information corresponding to the operation content. When the operation reception unit 19 accepts an operation specifying a group, the operation reception unit 19 sends information specifying the group to the group search unit 17. When the operation reception unit 19 accepts an operation specifying a level, the operation reception unit 19 sends information specifying the level to the level search unit 18.

Upon receiving the information (group name) specifying the group, the group search unit 17 sends, to the display control unit 16, an instruction for retrieval and display of the devices in the specified group. Upon receiving the information (level number) specifying the level, the level search unit 18 sends, to the display control unit 16, an instruction for retrieval and display of the devices at the specified level.

According to the instruction from the group search unit 17, the display control unit 16 extracts and causes the display device 101 to display the devices in the specified group. According to the instructions from the group search unit 17 and the level search unit 18, the display control unit 16 extracts and causes the display device 101 to display the devices at the specified level in the specified group.

Provided here are descriptions of a process of extracting and displaying the devices in the specified group and a process of extracting and displaying the devices at the specified level in the specified group. FIG. 9 illustrates the process that the debug support device according to the embodiment performs to extract the devices in the specified group and have these devices displayed. FIG. 9 illustrates a case where values of some devices displayed in decimal each come with a plus or minus sign.

Information in an upper part of FIG. 9 refers to hierarchical display information 180 being displayed by the display device 101. This hierarchical display information 180 includes two groups (Y0 and Y1). The hierarchical display information 180 includes a pull-down button (also referred to as "drop-down button" or "arrow button") 152 placed to allow selection of either one of the two groups. With a click on this pull-down button 152, "Y0" and "Y1" are displayed in a pull-down list. As the user specifies "Y0" or "Y1", the operation reception unit 19 sends the specified group name to the group search unit 17. The description here is of a case where "Y0" has been specified by the user.

Upon accepting the operation specifying "Y0", the operation reception unit 19 sends information specifying "Y0" to the group search unit 17. The group search unit 17 sends, to the display control unit 16, an instruction for display of the devices in the "Y0" group. According to the instruction from the group search unit 17 for the display of the devices in the "Y0" group, the display control unit 16 extracts from among those devices being displayed and causes the display device 101 to display the devices in the specified "Y0" group. Information in a lower part of FIG. 9 refers to hierarchical display information 181 on the extracted "Y0" group. Displaying the hierarchical display information 181 about the user-specified group enables the user to easily debug devices in the intended group.

Figure 10:
FIG. 10 illustrates a process that the debug support device according to the embodiment performs to extract devices at a specified level and have these devices displayed.

FIG. 10 illustrates the process that the debug support device according to the embodiment performs to extract the devices at the specified level and have these devices displayed. Information in an upper part of FIG. 10 refers to hierarchical display information 190 being displayed by the display device 101. This hierarchical display information 190 includes three groups (levels 1 to 3). The hierarchical display information 190 is the hierarchical display information 181 illustrated in FIG. 9 with a pull-down button 153 placed to allow selection of any one of the three levels. With a click on this pull-down button 153, "level 1", "level 2", and "level 3" are displayed in a pull-down list. As the user specifies any one of "level 1", "level 2", and "level 3", the operation reception unit 19 sends the specified level to the level search unit 18. The description here is of a case where "level 1" has been specified by the user.

Upon accepting the operation specifying "level 1", the operation reception unit 19 sends information specifying "level 1" to the level search unit 18. The level search unit 18 sends, to the display control unit 16, an instruction for display of the devices at "level 1". According to the instruction for the display of the devices at "level 1", the display control unit 16 extracts from among the devices in the "Y0" group being displayed and causes the display device 101 to display the devices at "level 1". Information in a lower part of FIG. 10 refers to hierarchical display information 191 on extracted "level 1" of the "Y0" group. Displaying the hierarchical display information 191 about the user-specified level enables the user to easily debug devices at the intended level.

A description is provided next of a process of extracting and displaying the devices belonging to the group and the level with a sub-number that have been specified.

Figures 11, 12:
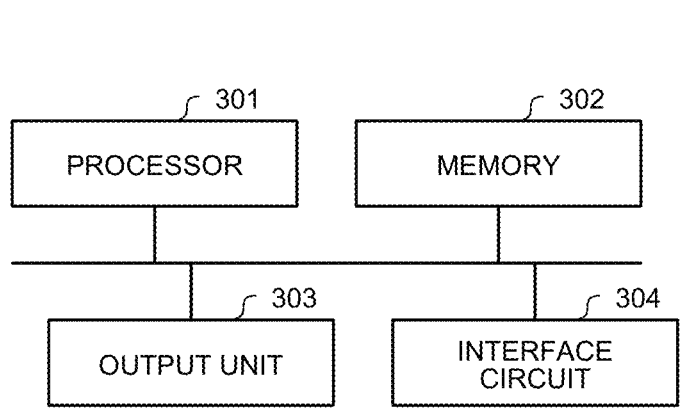
FIG. 11 illustrates a process that the debug support device according to the embodiment performs to extract devices belonging to a specified sub-number and have these devices displayed.
FIG. 12 illustrates a hardware configuration for implementation of the debug support device according to the embodiment.

FIG. 11 illustrates the process that the debug support device according to the embodiment performs to extract the devices belonging to the specified sub-number and have these devices displayed. Information in an upper part of FIG. 11 refers to hierarchical display information 195 being displayed by the display device 101. In this hierarchical display information 195, level 3 has two sub-numbers (as in 3-1 and 3-2). The hierarchical display information 195 is the hierarchical display information 190 illustrated in FIG. 10 with a pull-down list 154 displayed to allow selection of either one of the two sub-numbers.

As the user clicks the pull-down button 153 and selects "level 3", the display control unit 16 causes "level 3-1" and "level 3-2" to be displayed in a pull-down list. As the user specifies either "level 3-1" or "level 3-2", the operation reception unit 19 sends the specified sub-number to the level search unit 18. The description here is of a case where "level 3-1" has been specified by the user.

Upon receiving the operation specifying "level 3-1", the operation reception unit 19 sends, to the display control unit 16, an instruction for display of the devices at specified "level 3-1". According to the instruction for the display of the devices at "level 3-1", the display control unit 16 extracts from among the devices in the "Y0" group being displayed and causes the display device 101 to display the devices at "level 3-1". Information in a lower part of FIG. 11 refers to hierarchical display information 196 on extracted "level 3-1" of the "Y0" group. Displaying the hierarchical display information 196 about the user-specified sub-number enables the user to easily debug devices belonging to the intended sub-number.

As described above, the debug support device 10 divides the plurality of devices in the sequence program into groups each including the root device and the related devices that each determine the value of the root device, and extracts each of the groups. Because the debug support device 10 automatically registers, in the group storage unit 14, the values of all the devices in the extracted group, no time and effort is required to register the devices to be debugged. In other words, because of the automatic registration of the devices to be debugged by the debug support device 10, the user does not have to extract and register the devices to be debugged. Even if the sequence program has a large program size, the device registration is enabled in a short time. Consequently, debugging requires less time.

The sequence program is used to control pieces of equipment that are connected to the PLC. Therefore, the PLC controls the pieces of equipment by outputting signals based on the sequence program to the pieces of equipment. The output signals of the PLC are sent from output terminals of the PLC. The output devices correspond to the output terminals and are important devices in the sequence program. Therefore, the root device extraction unit 12 may limit a minimum necessary number of devices to be checked among all the root devices in the sequence program, to the output devices. In other words, the root device extraction unit 12 may have the root devices to be extracted as the output devices. In this way, the devices can be reduced to the small number when debugged, enabling less time for debugging.

Through the hierarchical display of the group, the debug support device 10 is also capable of causing each dependency relation between the result device and the factor device in the group to be displayed in a visible manner. This enables the user to not only check the values of the devices but consider each dependency relation between the devices when debugging. Moreover, the hierarchical display of the devices enables the user to readily look for the devices the user wants to debug even in the presence of an increased number of registered devices. Therefore, debugging requires less time.

The debug support device 10 is also capable of retrieving, for display, the devices on a group basis, thus enabling the user to expend less time and effort to look for the devices and less time on debugging. Moreover, visibility is improved with user attention being focused on the group being displayed, thus leading to prevention of erroneous checks on the devices.

Because the debug support device 10 is also capable of retrieving, for display, the devices on a level basis, the visibility is improved with the user attention focused on the displayed level, thus leading to prevention of erroneous checks on the devices.

The user can recognize the sequence program execution order on the basis of the devices displayed in the columns corresponding with the level numbers (i.e., the devices displayed in the tree structure on a level basis). This helps to locate a faulty part when the sequence program has any problem. By debugging every level number, the user can debug each and every one of the circuit blocks in the group. This prevents any checks from being missed.

A description is provided here of a hardware configuration of the debug support device 10. FIG. 12 illustrates the hardware configuration for implementation of the debug support device according to the embodiment. The debug support device 10 is implemented with a processor 301, a memory 302, an output unit 303, and an interface circuit 304. The processor 301 controls the memory 302, the output unit 303, and the interface circuit 304. The interface circuit 304 communicates with the devices external to the debug support device 10 (such as the program storage unit 20 and the operating device 102). The memory 302 stores information, while the output unit 303 outputs information to the display device 101.

Examples of the processor 301 include a central processing unit (CPU) that is also referred to as a processing unit, an arithmetic unit, a microprocessor, a microcomputer, a processor, or a digital signal processor (DSP), and a system large-scale integration (LSI). Examples of the memory 302 include a random-access memory (RAM) and a read-only memory (ROM).

The input unit 11 and the operation reception unit 19 are implemented with the interface circuit 304. The display control unit 16 is implemented with the output unit 303. The root device extraction unit 12, the related device retrieval unit 13, the hierarchical information creation unit 15, the display control unit 16, the group search unit 17, and the level search unit 18 are implemented with the processor 301. The group storage unit 14 is implemented with the memory 302.

The debug support device 10 is implemented as the processor 301 reads and executes a debug support program stored in the memory 302 to run the debug support device 10. The debug support program can be said to cause the computer to perform the procedure or method of the debug support device 10. The memory 302 is also used as a temporary memory when the processor 301 performs the various processes.

The debug support program to be executed by the processor 301 may be a computer program product that includes a non-transitory, computer-readable storage medium including a plurality of computer-executable instructions for the data processing. The debug support program to be executed by the processor 301 causes the computer to perform the data processing based on the plurality of instructions.

The debug support device 10 may be implemented with dedicated hardware. Some of the functions of the debug support device 10 may be implemented with dedicated hardware, while some of the other functions may be implemented with software or firmware.

In the embodiment described above, the root device is extracted from the sequence program, the related devices that each determine the value of the root device are extracted, and the root device, the value of the root device, the related devices, and the values of the related devices are associated and displayed. This makes it easier for the user to check each relation between the root device and the related device, enabling less laborious debugging.

The above configurations described in the embodiment are an example of content of the present invention, can be combined with other techniques that are publicly known, and can be partly omitted or changed without departing from the gist of the present invention.

REFERENCE SIGNS LIST 10 debug support device; 11 input unit; 12 root device extraction unit; 13 related device retrieval unit; 14 group storage unit; 15 hierarchical information creation unit; 16 display control unit; 17 group search unit; 18 level search unit; 19 operation reception unit; program storage unit; 30 programming unit; 100 program creation device; 101 display device; 102 operating device; 110 X0 device; 111, 115 M0 device; 112 X1 device; 113, 116 M1 device; 114 X2 device; 117, 119 M2 device; 118 X3 device; 120 Y0 device; 121 to 124, 130, 131 circuit block; 150, 160, 170 sequence program; 151, 161, 171, 180, 181, 190, 191, 195, 196 hierarchical display information; 152, 153 pull-down button; 154 pull-down list; 301 processor; 302 memory; 303 output unit; 304 interface circuit; CB circuit block.

The invention claimed is:

1. A debug support device comprising:
a processor; and
a memory to store a program which, when executed by the processor, performs processes of:
extracting, from a sequence program that includes a circuit block each including a plurality of devices, a result device on the basis of an association between a factor device that contributes to determination of a value of another device and the result device a value of which is determined by the factor device;
retrieving, as a related device, each and every one of the factor device(s) that determines a value of the result device; and
outputting group information to a display device, the group information being information on a group and associating the result device, a value of the result device, the related device, and a value of the related device, wherein
the processor extracts, from among a plurality of the result devices, a root device that does not behave as a factor device for each and every one of the plurality of the result devices in the sequence program,
the processor retrieves, as the related device, the each and every one of the plurality of the factor devices that determines a value of the root device, and
the root device, a value of the root device, the related device, and a value of the related device are associated in the group information.

2. The debug support device according to claim 1, wherein the processor further creates information on hierarchical display of the result device and the related device on the basis of the association and the group information, wherein
the processor outputs the information on the hierarchical display to the display device.

3. The debug support device according to claim 1, wherein
the result device and the related device that the display device displays are retrieved on a group basis by the processor according to an instruction from a user.

4. The debug support device according to claim 1, wherein
the processor sets a level for each of a plurality of the circuit blocks in the group, the levels serving as information corresponding to order of processing the circuit blocks, and
the result device and the related device that the display device displays are retrieved on a level basis by the processor according to an instruction from a user.

5. The debug support device according to claim 1, wherein
the processor has a root device to be extracted as an output device.

6. The debug support device according to claim 2, wherein
the processor puts a factor device closer in processing to an output device in a higher position in hierarchical display of the result device and the related devices.

7. A debug support method comprising:
extracting, from a sequence program that includes a circuit block including a plurality of devices, a result device on the basis of an association between a factor device that contributes to determination of a value of another device and the result device having a value determined by the factor device;
retrieving, as a related device, each and every one of the factor device(s) that determines a value of the result device;
outputting group information to a display device, the group information being information on a group and associating the result device, a value of the result device, the related device, and a value of the related device; and
causing the display device to display the group information, wherein
in the result device extraction, a root device that does not behave as a factor device for each and every one of a plurality of the result devices in the sequence program, is extracted from among the plurality of the result devices,
in the related device retrieval, the each and every one of the plurality of the factor devices that determines a value of the root device, is retrieved as the related device, and
the root device, a value of the root device, the related device, and a value of the related device are associated in the group information.

8. A non-transitory computer readable storage medium storing a debug support program to cause a computer to perform
extracting, from a sequence program that includes a circuit block including a plurality of devices, a result device on the basis of an association between a factor device that contributes to determination of a value of another device and the result device having a value determined by the factor device,
retrieving, as a related device, each and every one of the factor device(s) that determines a value of the result device, and
outputting group information to a display device, the group information being information on a group and associating the result device, a value of the result device, the related device, and a value of the related device, wherein
in the result device extraction, a root device that does not behave as a factor device for each and every one of a plurality of the result devices in the sequence program, is extracted from among the plurality of the result devices,
in the related device retrieval, the each and every one of the plurality of the factor devices that determines a value of the root device, is retrieved as the related device, and the root device, a value of the root device, the related device, and a value of the related device are associated in the group information.

9. The debug support device according to claim 2, wherein the result device and the related device that the display device displays are retrieved on a group basis by the processor according to an instruction from a user.

10. The debug support device according to claim 2, wherein the processor sets a level for each of a plurality of the circuit blocks in the group, the levels serving as information corresponding to order of processing the circuit blocks, and the result device and the related device that the display device displays are retrieved on a level basis by the processor according to an instruction from a user.

11. The debug support device according to claim 3, wherein the processor sets a level for each of a plurality of the circuit blocks in the group, the levels serving as information corresponding to order of processing the circuit blocks, and the result device and the related device that the display device displays are retrieved on a level basis by the processor according to an instruction from a user.

12. The debug support device according to claim 9, wherein the processor sets a level for each of a plurality of the circuit blocks in the group, the levels serving as information corresponding to order of processing the circuit blocks, and the result device and the related device that the display device displays are retrieved on a level basis by the processor according to an instruction from a user.

* * * * *